(12) United States Patent
Camenforte, III et al.

(10) Patent No.: US 9,564,410 B2
(45) Date of Patent: Feb. 7, 2017

(54) SEMICONDUCTOR DEVICES HAVING METAL BUMPS WITH FLANGE

(71) Applicant: Texas Instruments Incorporated, Dallas, TX (US)

(72) Inventors: Floro Lopez Camenforte, III, Pampanga (PH); James Raymond Maliclic Baello, Pampanga (PH); Armando Tresvalles Clarina, Jr., Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/793,813

(22) Filed: Jul. 8, 2015

(65) Prior Publication Data

US 2017/0012012 A1    Jan. 12, 2017

(51) Int. Cl.
*H01L 21/50*      (2006.01)
*H01L 21/48*      (2006.01)
(Continued)

(52) U.S. Cl.
CPC ........... *H01L 24/13* (2013.01); *H01L 21/4853* (2013.01); *H01L 21/76834* (2013.01); *H01L 21/78* (2013.01); *H01L 23/49844* (2013.01); *H01L 24/03* (2013.01); *H01L 24/05* (2013.01); *H01L 24/11* (2013.01); *H01L 2224/036* (2013.01); *H01L 2224/0345* (2013.01); *H01L 2224/0346* (2013.01); *H01L 2224/0401* (2013.01); *H01L 2224/0569* (2013.01); *H01L 2224/05147* (2013.01); *H01L 2224/05541* (2013.01); *H01L 2224/05582* (2013.01); *H01L 2224/05647* (2013.01); *H01L 2224/116* (2013.01); *H01L 2224/1145* (2013.01); *H01L 2224/1146* (2013.01); *H01L 2224/13016* (2013.01); *H01L 2224/13147* (2013.01); *H01L 2924/01022* (2013.01); *H01L 2924/01042* (2013.01);
(Continued)

(58) Field of Classification Search
CPC ................. H01L 21/78; H01L 21/4853; H01L 21/76834; H01L 23/49827; H01L 23/49844; H01L 24/03; H01L 24/05; H01L 24/11; H01L 24/13
USPC ........ 438/106, 107, 612, 613; 257/737, 738, 257/786, E21.59, E21.158, E21.499, 257?E23.068, E23.069, E23.141
See application file for complete search history.

(56) References Cited

U.S. PATENT DOCUMENTS

2006/0091541 A1* 5/2006 Bojkov .................. H01L 24/05
                                                        257/737
2011/0024905 A1* 2/2011 Lin .................. H01L 23/49816
                                                        257/738
(Continued)

*Primary Examiner* — Dao H Nguyen
(74) *Attorney, Agent, or Firm* — Rose Alyssa Keagy; Charles A. Brill; Frank D. Cimino

(57) ABSTRACT

A semiconductor device having a terminal site (100) including a flat pad (110) of a first metal covered by a layer (130) of dielectric material, the layer over the pad parallel to the pad and having a window of a first diameter (132) exposing the surface of the underlying pad. The terminal site further has a patch-shaped film (140) of a second metal covering the surface of the exposed first metal and the surface of an annulus of the dielectric layer framing the window, the film patch having a second diameter (141) greater than the first diameter; and a bump (150) of a third metal adhering to the film, the bump having a third diameter (151) smaller than the second diameter, whereby the film protrudes like a flange from the bump.

20 Claims, 2 Drawing Sheets

(51) Int. Cl.
*H01L 23/498* (2006.01)
*H01L 23/00* (2006.01)
*H01L 21/768* (2006.01)
*H01L 21/78* (2006.01)

(52) U.S. Cl.
CPC ............... *H01L 2924/01073* (2013.01); *H01L 2924/01074* (2013.01); *H01L 2924/2064* (2013.01)

(56) References Cited

U.S. PATENT DOCUMENTS

| | | | | |
|---|---|---|---|---|
| 2012/0248605 | A1* | 10/2012 | Yamaguchi | H01L 24/03 257/738 |
| 2013/0341785 | A1* | 12/2013 | Fu | H01L 23/3192 257/737 |
| 2015/0262952 | A1* | 9/2015 | Lee | H01L 24/13 257/737 |

* cited by examiner

SEMICONDUCTOR DEVICES HAVING METAL BUMPS WITH FLANGE

FIELD

Embodiments of the invention are related in general to the field of semiconductor devices and processes, and more specifically to the structure and fabrication method of semiconductor chips having metal pillars with shoulder suitable for flip-chip assembly.

DESCRIPTION OF RELATED ART

Electronic applications such as handheld telephones and other wireless products offer the customer an ever increasing number of features, while the sizes of the telephones and other products keep shrinking. As a consequence, there is an ongoing trend for the semiconductor devices inside these products to miniaturize the size of the devices while increasing the number of functional device terminals. The shrinking device dimensions at increasing terminal numbers translate into ever finer pitch of the interconnections used by these devices. Today, the preferred technology for interconnecting a semiconductor chip to a substrate is by forming metallic bumps on the chip, then to flip the chip and solder-attach it onto the substrate. Likewise, the preferred technology for interconnecting a packaged device to a board is by using solder balls for flip-attaching the device to the board.

As an example, an emerging option for fine-pitch flip-chip interconnect utilizes circular copper bumps plated onto the terminals (contact pads) of the semiconductor chip; the bumps are then connected with solder to the copper traces of the substrate. An advantage of this approach is the possibility to fabricate the copper bumps in a wafer-level process; the photoresist technology used in this process determines the aspect ratio (height and diameter) of the bumps. The minimum diameter achieved for the bumps is 25 μm.

Contemporary silicon chips have the terminals of integrated circuits often formed by the top metal layer made of copper. A layer of polymeric material, such as polyimide, is used to define windows to the copper surface. When a metallic bumps is to be attached to the copper surface exposed in a window, the bump typically forms a slight overhang over the polymeric sidewall framing the window. The bumps are then attached by solder to substrates such as metallic leadframes. During temperature cycles caused by operating the finished device or by reliability stress tests, the bumps exert thermo-mechanical stress on the polymeric layer, which may cause cracks of the layer and finally failure of the device.

SUMMARY

Analyzing device failures by cracked polyimide layers, inflicted during temperature cycling and other reliability tests, applicants found good agreement between the location and magnitude of the cracks and the predictive results of maxima in thermo-mechanical stress modeling. Due to their divergent coefficients of thermal expansion (CTE), the joints of metal bumps and insulating layers have been found to be particularly vulnerable.

Applicant discovered a solution to the problem of thermo-mechanical stress maxima at metal/insulator interfaces when they detected a simple and inexpensive method to distribute the stress and thus weaken it to a level no longer critical the integrity of insulating layers. Applicants devised a method for forming a metallic flange protruding from a metal bump so that the flange is adhering to the bumps and rests on the insulating layer. The position of the flange distributes thermo-mechanical stress at the bump/insulator interface over a wide annulus of insulating material. The thinned stress level no longer endangers the integrity of the insulating layer.

Experiments showed that the thickness of the flanges may preferably be in the low micrometer range. The diameter of a flange is preferably selected so that the resulting flange will not touch its nearest adjacent neighboring flange.

DETAILED DESCRIPTION OF THE PREFERRED EMBODIMENTS

Figure 1:
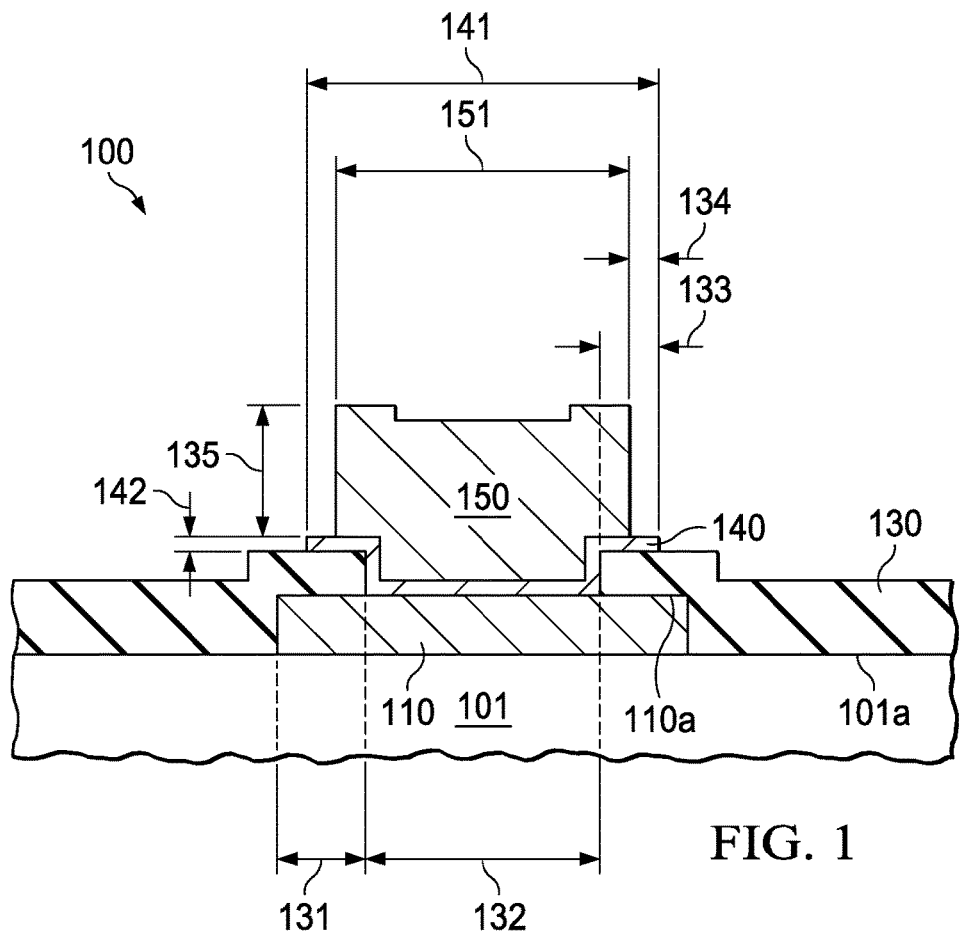
FIG. 1 illustrates a schematic cross section of a terminal of a semiconductor device including a metallic bump with a metallic flange on the terminal according to the invention.

As an embodiment of the invention, FIG. 1 illustrates a cross section through a portion of an exemplary semiconductor device including the flat surface 101a of semiconductor chip 101 and a terminal 100 of the device. The semiconductor material may be silicon, germanium, silicon germanium, gallium arsenide, gallium nitride, or any other semiconductor material used for electronic devices. The terminal is a bond site, which includes a pad 110 of a first metal. Pad 110 is preferably flat and has a flat surface 110a. The first metal may be copper, aluminum, alloys thereof, or any other suitable metal or alloy.

The surface of chip 101 is covered by a dielectric layer 130, which overlaps pad 110 for a length 131. The dielectric material may be a polymeric compound such as polyimide, or any other suitable insulating material such as silicon nitride, silicon dioxide or other inorganic non-conductive compounds. As an example, layer 130 may be about 10 μm thick, but may be thicker or thinner. Preferably, overlap 131 of layer 130 over pad 110 is parallel to the pad; overlap 131 forms a window of a first diameter 132, which exposes the surface 110a of the underlying pad 110.

The exemplary device of FIG. 1 further shows a film 140 of a second metal adhering to the surface area of the exposed first metal and also adhering to the surface area of an annulus of the dielectric layer framing the window. In FIG. 1, the width of the annulus is designated 133. As FIG. 1 shows, film 140 is generally patterned so that it resembles a metallic patch with a second diameter 141 greater than the first diameter 132. The second metal may be copper or a copper alloy; preferably the second metal has metallurgical affinity to metal bumps 150; preferably, it is made of the same metal or alloy as bump 150. In the embodiment example of FIG. 1, film 140 is a thin layer with a thickness 142 of about 2 μm.

The exemplary embodiment of FIG. 1 further depicts a bump 150 of a third metal adhering to film 140. Bump 150 has a third diameter 151 smaller than the second diameter 141 and preferably greater than the first diameter 132. As a result, the film protrudes like a shoulder or flange of length 134 from the bump. The third metal is preferably copper or a copper alloy; for some devices, bump 150 is made of gold or a gold alloy. The bump height 135 is for many devices at least 10× greater than the film thickness 142; as an example, height 135 may be about 35 μm. When height 135 surpasses diameter 151 considerably, bump 150 may be referred to as an elongated post or pillar with the elongation vertically oriented relative to flat pad 110.

Figure 2:
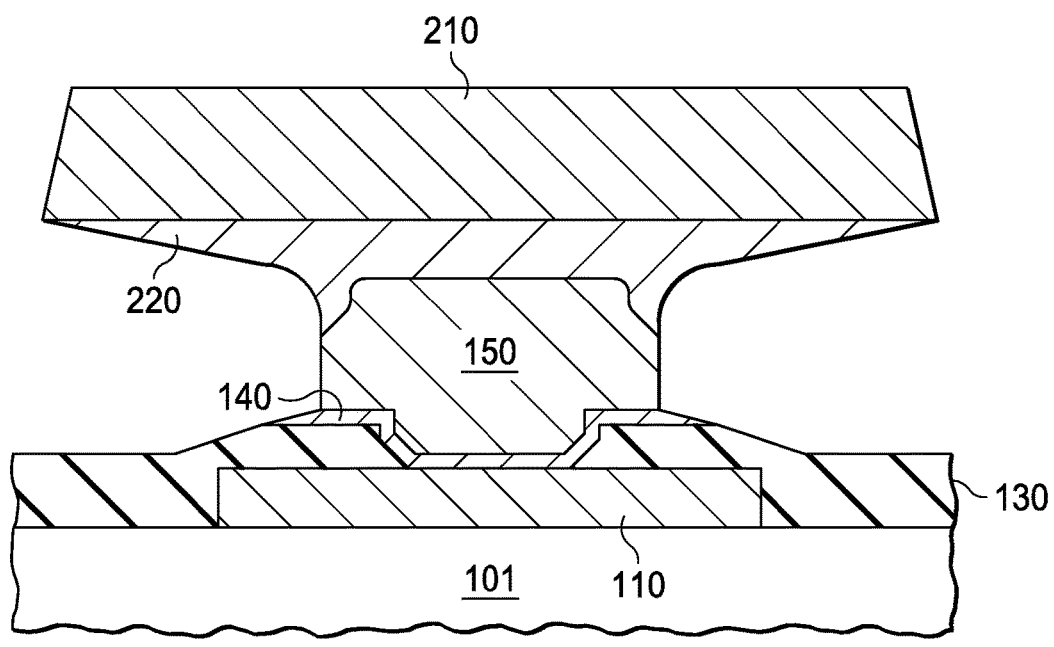
FIG. 2 shows a microphotograph of a cross section through an actual device terminal attached to a substrate; the metallic bump used for attachment has a metallic flange according to the invention.

The chip with a bump 150 attached to each device terminal site 110 is then mounted onto a substrate 210, for example a metallic leadframe or a laminated board, by attaching the bumps to the substrate contact sites using solder 220. FIG. 2 illustrates a cross section of a solder-assembled bump with flanges 140 according to the invention.

Evaluating the sensitivity to thermo-mechanical stress, controlled reliability tests between semiconductor devices with bump flanges 134 compared to devices without flanges demonstrated clearly the superiority of the flanges. The much reduced failure rate by cracks through the insulating layers 131 can be shown to be due to distributing or partially absorbing the stress by the flanges.

Figure 3:
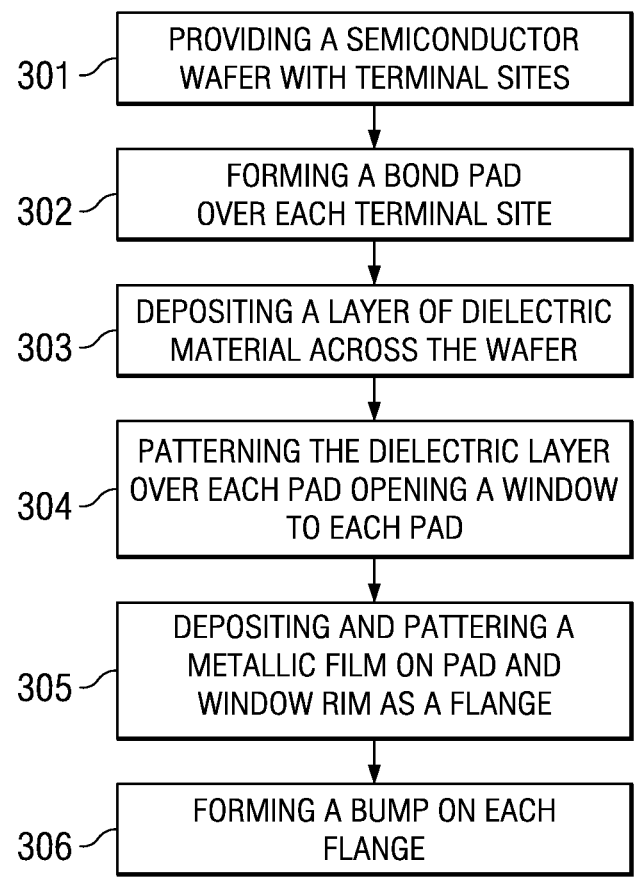
FIG. 3 depicts a diagram of the process flow for batch-fabricating semiconductor chips with terminals formed as bumps with flanges.

Another embodiment of the invention is a method for batch-fabricating semiconductor chips with enhanced robustness against thermo-mechanical stress. The method involves the preparation of the device terminals and starts, as shown in process 301 of FIG. 3, by providing a semiconductor wafer with a plurality of devices, wherein each device has a plurality of bond sites. Process 302 indicates that bond pads are formed over each terminal site, preferably by selecting a metal area 110 of the top metallization layer of the chip. Preferably, the pad 110 is flat and made of a first metal (such as copper or aluminum or an alloy) adhering to the wafer material of the site.

In more detail, the process of forming bond pads includes the process of sputtering a metallic seed layer onto the wafer so that the seed layer covers the device sites and adheres to the wafer material. Preferred seed metals include titanium and tungsten and other refractory metals such as tantalum, molybdenum, and chromium. Then the seed layer is patterned to form a bond site for each terminal of the devices. A layer of a first metal 110 is then plated onto the patterned metal seed layer. Preferred first metal for bond sites is copper or a copper alloy; alternatively, aluminum or an aluminum alloy may be used.

In the next process 303, a layer 130 of dielectric material is deposited across the wafer. The layer also covers the metallic pads 110 of all bond sites. For many device types, polyimide or a derivative is preferred as material for layer 130. Then in process 304, the dielectric layer over each pad 110 is patterned, preferably by photolithographic technology, to open a window of a first diameter 132 to each pad. The window exposes the surface of the underlying metal pad 110.

In process 305, a flange for bumps is formed on each bond site, the flange being a thin layer or film 140 of a second metal adhering to the first metal 110 as well as to the dielectric material 13; the film has a second diameter 141 greater than the first diameter 132.

The process of forming film 140 includes the support of several processes. A metallic seed layer is sputtered onto the wafer, the seed layer adhering to the first metal 110 as well as to the dielectric material 130. The metallic seed layer may include a refractory metal including, but not limited to, titanium, tungsten, tantalum, and molybdenum, and alloys thereof. Then, the seed layer is patterned to retain patches over each window so that the patches cover the areas of the exposed first metal and of an annular frame around the window in the dielectric layer. The total patch area has a second diameter 141 greater than the first diameter 132. Second diameter 141 is selected so that that the resulting patches will not touch their nearest adjacent neighboring patches. Finally, a film 140 of a second metal is plated onto the patches of the seed metal. A preferred thickness 142 of the plated metal is about 2 μm; while even thinner plated layers may be effective, many devices prefer thicker layers for layer 140. Preferably, the second metal includes copper; for many devices, a copper alloy is preferred, which provides a modulus for the flanges in the stiff regime of the stress/strain diagram.

The preparation of the device terminals concludes in process 306 by forming a bump of a third metal on the terminals for enabling assembly of the device. Suitable bumps have a third diameter 151 smaller than the second diameter 141 and preferably greater than the first diameter 132.

The method of forming bumps includes the process of sputtering a metallic seed layer onto the plated film 140 and patterning the seed layer to retain areas of a third diameter 151 smaller than the second diameter 141. Then, onto each patterned seed area a bump of a third metal is plated, which adheres to the film. Preferably the third metal is copper or a copper alloy. Alternatively, the third metal may be gold or a gold alloy. For some devices it is acceptable that the height 135 of the bump is smaller than its diameter 151. For many other devices, however, it is advisable to have bumps with a height 135 significantly greater than diameter 151. It is preferred that height 135 is at least ten times or more than thickness 142 of the metal film forming the flange. These bumps are then appropriately called pillars. The elongated dimension of the pillars is vertical to the flat pad.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to semiconductor chips using any type and any number of terminals, discrete or integrated circuits; it further applies to passive components with terminals using metallic bumps, and to any material of the semiconductor chips including silicon, silicon germanium, gallium arsenide, or any other semiconductor or compound material used in semiconductor manufacturing. It is therefore intended that the appended claims encompass any such modifications or embodiment.

We claim:

1. A method for fabricating a semiconductor chip comprising:

providing a semiconductor wafer having a plurality of devices, each device having a plurality of terminal sites;

forming a bond pad over each of the plurality of terminal sites, the bond pad being flat and made of a first metal adhering to semiconductor wafer;

depositing a layer of dielectric material across the semiconductor wafer covering the bond pads of all terminal sites;

patterning the layer of dielectric material over each bond pad to open a window of a first diameter to each bond pad, the window exposing the surface of the underlying bond pad;

forming a flange for bumps on each bond pad; comprising:

sputtering a metallic seed layer of a refractory metal over the semiconductor wafer;

subsequently patterning the metallic seed layer to form patches of the refractory metal over the window and the surface of the bond pad at each terminal site, the patches having a second diameter greater than the first diameter; and using the patches as a seed material, plating to form the flange on the bond pad at each terminal site, the flange being a film of a second metal adhering to the first metal as well as to the layer of dielectric material; and forming a bump of a third metal on each flange, the bump having a third diameter smaller than the second diameter.

2. The method of claim 1 wherein forming a bond pad over each of the plurality of terminal sites further includes the processes of:

sputtering a metallic seed layer onto the semiconductor wafer, the seed layer covering the terminal sites and adhering to the semiconductor wafer;

patterning the metallic seed layer to form a plurality of bond pads for each device; and plating a layer of a first metal onto the patterned metallic seed layer.

3. The method of claim 2 wherein the metallic seed layer includes a refractory metal including, but not limited to, titanium, tungsten, tantalum, and molybdenum, and alloys thereof.

4. The method of claim 2 wherein the first metal includes copper.

5. The method of claim 1 wherein the second metal includes copper.

6. The method of claim 1 wherein forming a bump includes the processes of:

sputtering a metallic seed layer onto the plated film forming the flange at each bond pad and overlying the semiconductor wafer;

subsequently, patterning the metallic seed layer to retain areas of a third diameter smaller than the second diameter on the film of material forming flanges at each bond pad terminal site; and subsequently, plating onto each patterned seed area an elongated pillar of a third metal adhering to the film, the pillar having the third diameter and an elongation vertical to the bond pad.

7. The method of claim 6 wherein the third metal includes copper.

8. The method of claim 7 wherein the bump is elongated and resembles a pillar.

9. The method of claim 1 wherein the second diameter of the total patch area is further selected so that the resulting patches will not touch their nearest adjacent neighboring patches.

10. The method of claim 1 wherein the third diameter is furthermore greater than the first diameter.

11. A method, comprising:

forming a first metallic seed layer over the surface of a semiconductor wafer having a plurality of devices formed therein;

patterning the first metallic seed layer to form a plurality of bond pad sites for each of the devices;

plating a metal comprising copper on the plurality of bond pad sites to form a plurality of bond pads for each of the devices;

depositing a dielectric layer over the semiconductor wafer and covering the bond pads;

patterning the dielectric layer over each of the bond pads to open a window of a first diameter exposing a surface of the bond pads;

forming a flange for forming bumps on each of the bond pads, comprising:

depositing a second metallic seed layer of a refractory metal over the surface of the semiconductor wafer and covering the window at each of the bond pads;

patterning the second metallic seed layer to form patches overlying each of the windows and the exposed surface of the bond pads and having a portion overlying the dielectric layer, the patches having a second diameter greater than the first diameter, the patches being spaced from one another;

plating a metal comprising copper on the patches to form a metallic flange at each of the bond pads having the second diameter;

depositing third metallic seed layer over the semiconductor wafer and covering the metallic flange at each of the bond pad site;

patterning the third metallic seed layer to retain areas of the third metallic seed layer over the metallic flanges, the areas of the third metallic seed layer having a third diameter smaller than the second diameter; and plating a bump material comprising copper onto the third metallic seed layer to form bumps having the third diameter at the base.

12. The method of claim 11, wherein the second metallic seed layer comprises at least one selected from the group consisting essentially of: titanium, tungsten, tantalum, molybdenum and alloys thereof.

13. The method of claim 11, wherein the film of copper material forming the metallic flange has a thickness of less than or equal to about 2 microns.

14. The method of claim 11, wherein the film of copper material forming the metallic flange comprises a copper alloy.

15. The method of claim 11, wherein the bumps have an elongated shape extending vertically from the bond pads and away from the surface of the semiconductor wafer.

16. The method of claim 15, wherein the bumps resemble a pillar.

17. The method of claim 11, wherein the bumps comprise a copper alloy.

18. The method of claim 11, wherein depositing the dielectric material comprises depositing a polyimide.

19. The method of claim 11, wherein the semiconductor wafer comprises one selected from the group consisting essentially of: silicon, silicon germanium, germanium, gallium arsenide, and gallium nitride.

20. A method for forming a bumped semiconductor wafer, comprising:

forming a first metallic seed layer of a refractory metal over the surface of a semiconductor wafer having a plurality of devices formed therein;

patterning the first metallic seed layer to form a plurality of bond pad sites for each of the devices;

plating a metal comprising copper on the plurality of bond pad sites to form a plurality of bond pads for each of the devices;

depositing a layer of polyimide over the surface of the semiconductor wafer and covering the bond pads;

patterning the polyimide layer over each of the bond pads to open a window of a first diameter exposing a surface of the bond pads;

forming a flange for copper bumps on each of the bond pad sites, comprising:
  depositing a second metallic seed layer of a refractory metal over the surface of the semiconductor wafer covering the window at each of the bond pad sites;
  patterning the second metallic seed layer to form patches overlying each of the bond pads and the windows and overlying the polyimide layer around the windows, the patches having a second diameter greater than the first diameter, the patches being spaced from one another;
  plating a copper metal on the patches to form a metallic flange at each of the bond pad sites having the second diameter, the metallic flange being a film of the copper metal material covering the bond pad, extending into the windows and over the polyimide around the windows;
depositing a third metallic seed layer over the semiconductor surface and covering the metallic flange at each of the bond pad sites;
patterning the third metallic seed layer to retain areas of the third metallic seed layer over the metallic flanges, the retained areas of the third metallic seed layer having a third diameter smaller than the second diameter; and
plating a copper bump material onto the third metallic seed layer to form copper pillar bumps having the third diameter at the base and extending away from the semiconductor wafer at each of the bond pad sites.

* * * * *